(12) United States Patent
Satoh et al.

(10) Patent No.: US 9,096,950 B2
(45) Date of Patent: Aug. 4, 2015

(54) NITRIDE CRYSTAL AND METHOD FOR PRODUCING THE SAME

(75) Inventors: Takashi Satoh, Miyagi (JP); Seiji Sarayama, Miyagi (JP); Hirokazu Iwata, Miyagi (JP); Yusuke Mori, Osaka (JP); Yasuo Kitaoka, Osaka (JP)

(73) Assignees: RICOH COMPANY, LTD., Tokyo (JP); OSAKA UNIVERSITY, Osaka (JP)

( * ) Notice: Subject to any disclaimer, the term of this patent is extended or adjusted under 35 U.S.C. 154(b) by 1033 days.

(21) Appl. No.: 13/164,939

(22) Filed: Jun. 21, 2011

(65) Prior Publication Data

US 2012/0003446 A1     Jan. 5, 2012

(30) Foreign Application Priority Data

Jul. 1, 2010 (JP) .................................. 2010-151337

(51) Int. Cl.
*B32B 7/02* (2006.01)
*C30B 29/40* (2006.01)
*C30B 9/10* (2006.01)

(52) U.S. Cl.
CPC ................ *C30B 29/406* (2013.01); *C30B 9/10* (2013.01); *C30B 29/403* (2013.01); *Y10T 428/24942* (2015.01)

(58) Field of Classification Search
CPC ........ C30B 29/403; C30B 29/406; C30B 9/00
USPC ...................... 428/212; 117/73, 74
See application file for complete search history.

(56) References Cited

U.S. PATENT DOCUMENTS

| | | |
|---|---|---|
| 6,592,663 B1 | 7/2003 | Sarayama et al. |
| 6,780,239 B2 | 8/2004 | Sarayama et al. |
| 6,949,140 B2 | 9/2005 | Sarayama et al. |
| 7,001,457 B2 | 2/2006 | Sarayama et al. |
| 7,220,311 B2 | 5/2007 | Iwata et al. |
| 7,250,640 B2 | 7/2007 | Sarayama et al. |
| 7,261,775 B2 | 8/2007 | Iwata et al. |
| 7,309,534 B2 | 12/2007 | Kitaoka et al. |
| 7,462,238 B2 | 12/2008 | Sarayama et al. |
| 7,508,003 B2 | 3/2009 | Sarayama et al. |
| 7,531,038 B2 | 5/2009 | Sarayama et al. |

(Continued)

FOREIGN PATENT DOCUMENTS

| | | |
|---|---|---|
| EP | 1548160 A1 | 6/2005 |
| EP | 1614776 A2 | 1/2006 |

(Continued)

OTHER PUBLICATIONS

Ohtoshi, T., et al. (1997), "Dependence of optical gain on crystal orientation in wurtzite-GaN strained quantum-well lasers," Journal of Applied Physics, vol. 82, No. 4, pp. 1518-1520.

(Continued)

*Primary Examiner* — Maria Veronica Ewald
*Assistant Examiner* — Laura Auer
(74) *Attorney, Agent, or Firm* — Cooper & Dunham LLP (57) ABSTRACT

A nitride crystal which encircles an outer periphery of a seed crystal, the nitride crystal in an embodiment includes: a first partial region, and a second partial region that has optical characteristics different from those of the first partial region and has optical characteristics which indicate the crystal orientation.

11 Claims, 9 Drawing Sheets

(56) References Cited

U.S. PATENT DOCUMENTS

| | | |
|---|---|---|
| 7,718,002 B2 | 5/2010 | Sarayama et al. |
| 7,828,896 B2 | 11/2010 | Iwata et al. |
| 2003/0164138 A1 | 9/2003 | Sarayama et al. |
| 2004/0134413 A1 | 7/2004 | Iwata et al. |
| 2004/0262630 A1 | 12/2004 | Kitaoka et al. |
| 2005/0026318 A1 | 2/2005 | Sarayama et al. |
| 2006/0051942 A1 | 3/2006 | Sasaki et al. |
| 2007/0084399 A1 | 4/2007 | Sarayama et al. |
| 2007/0128746 A1 | 6/2007 | Iwata et al. |
| 2007/0169689 A1 | 7/2007 | Kobayashi et al. |
| 2007/0194408 A1 | 8/2007 | Iwata et al. |
| 2007/0215034 A1 | 9/2007 | Iwata et al. |
| 2008/0081015 A1 | 4/2008 | Sarayama et al. |
| 2008/0220346 A1 | 9/2008 | Sarayama et al. |
| 2008/0264331 A1 | 10/2008 | Iwata et al. |
| 2008/0271665 A1 | 11/2008 | Yamazaki et al. |
| 2008/0282969 A1 | 11/2008 | Sarayama et al. |
| 2009/0120354 A1 | 5/2009 | Sarayama et al. |
| 2009/0173274 A1 | 7/2009 | Sarayama et al. |
| 2009/0249997 A1 | 10/2009 | Sarayama et al. |
| 2010/0059717 A1 | 3/2010 | Mori et al. |
| 2010/0229787 A1 | 9/2010 | Sarayama et al. |
| 2010/0322841 A1 * | 12/2010 | Okahisa et al. ............... 423/409 |
| 2011/0012235 A1 | 1/2011 | Iwata et al. |

FOREIGN PATENT DOCUMENTS

| | | |
|---|---|---|
| EP | 1806440 A2 | 7/2007 |
| EP | 1916321 A1 | 4/2008 |
| EP | 2103721 A1 | 9/2009 |
| JP | 7-108338 | 4/1995 |
| JP | 2002-356398 | 12/2002 |
| JP | 2003-292400 | 10/2003 |
| JP | 2006-8416 | 1/2006 |
| JP | 2006-45047 | 2/2006 |
| JP | 3868156 | 10/2006 |
| JP | 2008-94704 | 4/2008 |
| JP | 2008-110910 | 5/2008 |
| WO | WO 2009096125 A1 * | 8/2009 |

OTHER PUBLICATIONS

Park, Seoung-Hwan, et al. (1999), "Crystal-orientation effects on the piezoelectric field and electronic properties of strained wurtzite semiconductors," Physical Review B, vol. 59, No. 7, pp. 4725-4737.
European Search Report dated Mar. 6, 2014 in corresponding European patent application No. 11 172 415.9.
Korean official action dated Jun. 21, 2013 and translation in corresponding Korean patent application No. 10-2011-0064728.
Tadao Hashimoto, et al., Ammonothermal growth of bulk GaN, Journal of Crystal Growth, 2008, vol. 310, pp. 3907-3910.
Kenji Fujito, et al., Bulk GaN crystals grown by HVPE, Journal of Crystal Growth, 2009, vol. 311, pp. 3011-3014.
Yamane, Hisanori, et al. (1997), "Preparation of GaN Single Crystals Using a Na Flux," Chemistry of Materials, vol. 9, pp. 413-416.
Sep. 26, 2011 European search report in connection with counterpart European patent application No. 11 17 2415.
Korean official action dated Nov. 20, 2012 in connection with corresponding Korean patent application No. 10-2011-0064728.

* cited by examiner

NITRIDE CRYSTAL AND METHOD FOR PRODUCING THE SAME

CROSS-REFERENCE TO RELATED APPLICATIONS

The present application claims priority to and incorporates by reference the entire contents of Japanese Patent Application No. 2010-151337 filed in Japan on Jul. 1, 2010.

BACKGROUND OF THE INVENTION

1. Field of the Invention

The present invention relates to a nitride crystal and a method for producing the same.

2. Description of the Related Art

Gallium nitride (GaN), which is a wide band gap semiconductor, is known as a material that emits light with a short wavelength such as blue light or ultraviolet light radiation. Furthermore, since GaN has high thermal conductivity and high breakdown strength, it is expected that GaN can realize electronic devices for high-frequency and high power electronic devices that are difficult to realize such as silicon (Si) or gallium arsenide (GaAs) is used.

In regard to the production of GaN substrates, GaN substrates having a diameter ($\phi$) of about 2 inches have been produced by growing a thick film of GaN by a halide vapor phase epitaxy (HVPE) method on a base substrate made of a different material, such as a sapphire substrate or a GaAs substrate, and then by separating the thick film of GaN from the base substrate. However, since the HVPE method involves heterogeneous epitaxial growth of a GaN crystal on a base substrate made of a different material, a difference in the thermal expansion coefficient or lattice mismatch between the GaN and the base substrate is difficult to prevent. Accordingly, the dislocation density of GaN produced by a HVPE method is as high as about $10^6$ cm$^{-2}$, and there is a strain occurs in GaN due to a difference in thermal expansion between GaN and the substrate. Therefore, a further quality improvement of GaN substrates is desired.

Furthermore, the size of GaN substrates that is required for use in electronic devices is 4 inches or larger in diameter; and increase of the substrate size as well as uniformity of quality among substrates are desired. Moreover, non-polar GaN substrates are considered desirable as the GaN substrates for optical device applications, for the purpose of suppressing the influence of piezoelectric polarization that occurs concomitantly with an increase in the applied voltage. In order to solve the problems described above, it is necessary to develop a high quality bulk GaN crystal.

One method that has been researched and developed to grow a high quality bulk GaN crystal is a flux method in which nitrogen is dissolved in a mixed molten liquid of sodium (Na) and gallium (Ga); and GaN is crystallized and grown therefrom. The flux method is capable of growing a crystal at relatively low temperatures such as 700° C. to 900° C., and the pressure inside the vessel is also relatively low to a level of merely 100 kg/cm$^2$. Thus, the flux method is a practical method for crystal growth.

An article, published in Chemistry of Materials, Vol. 9, 413-416 (1997), reports an example of growing a GaN crystal using sodium azide (NaN$_3$) and Ga as source materials, whereby the source materials are placed and sealed together with nitrogen in a reaction vessel made of stainless steel; and the reaction vessel is maintained at a temperature of 600° C. to 800° C. for 24 to 100 hours.

Japanese Patent Application Laid-open No. 2008-94704 discloses a method for producing a large-sized crystal of GaN by a flux method, in which a needle-like crystal of aluminum nitride (AlN) is used as a seed crystal to grow a columnar crystal of GaN. Furthermore, Japanese Patent Application Laid-open No. 2006-45047 discloses a method for producing a needle-like crystal of AlN that is used as a seed crystal. As such, production of a large-sized crystal by performing crystal growth of a seed crystal by a flux method is a well-known technology.

However, GaN wafers that are obtainable by processing the GaN crystals obtained as described above are not easily visible, because the GaN crystals are colorless transparent crystals, and particularly when the place where a GaN wafer is to be mounted is either white in color or transparent, there is a flaw that it is difficult to find out the exact location of the wafer.

In this regard, Japanese Patent Application Laid-open No. 2002-356398 discloses a technology of making it easier to recognize the contour of the wafer by chamfering the circumferential edge of a GaN substrate that has been shaped into a wafer, and thereby making light diffusely reflected thereon. According to Japanese Patent Application Laid-open No. 2002-356398, the crystal orientation of a GaN crystal can be conveniently identified by forming an orientation flat (OF) on the {10-10} planes, which are cleavage planes of the GaN crystal.

However, in the related art technologies disclosed in Japanese Patent Application Laid-open No. 2002-356398 and the like, there is a need for further processing of GaN substrates such as chamfering or OF formation. Because GaN crystals are hard, fragments (chippings) are likely to be generated during cutting and polishing, and there is a risk that the chippings thus generated may serve as starting points for the breakage of the wafer. Also, in the case of forming an orientation flat (OF) or an interface (IF), there is a flaw in that the amount of loss of the material needed to cut away some parts of the wafer is large.

SUMMARY OF THE INVENTION

It is an object of the present invention to at least partially solve the problems in the conventional technology.

According to an aspect of the present invention, there is provided a nitride crystal which encircles an outer periphery of a seed crystal, the nitride crystal including: a first partial region, and a second partial region that has optical characteristics different from those of the first partial region and has optical characteristics which indicate the crystal orientation.

According to another aspect of the present invention, there is provided a method for producing a nitride crystal, the method including: forming a mixed molten liquid of an alkali metal and a substance including at least a Group III element in a reaction vessel; installing a seed crystal inside the reaction vessel; and growing a Group III nitride crystal in the mixed molten liquid and the nitrogen dissolved into the mixed molten liquid, from the seed crystal by bringing a gas containing nitrogen into contact with the mixed molten liquid and by dissolving the nitrogen in the gas into the mixed molten liquid, at the same time forming a first partial region and a second partial region within the nitride crystal, wherein the second partial region has optical characteristics different from those of the first partial region and has optical characteristics which indicate the crystal orientation.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Hereinafter, embodiments of a nitride crystal according to the present invention and a method for producing the nitride crystal will be described in detail with reference to the attached drawings. In the following descriptions, the drawings schematically show the shape, size and arrangement of the constituent elements only to the extent that the embodiment can be understood, and the present invention is not intended to be particularly limited by these drawings. Furthermore, identical constituent elements shown in plural diagrams will be respectively assigned with identical numerals, and explanations for such constituent elements will not be repeated.

Crystal Producing Apparatus

Figure 1:
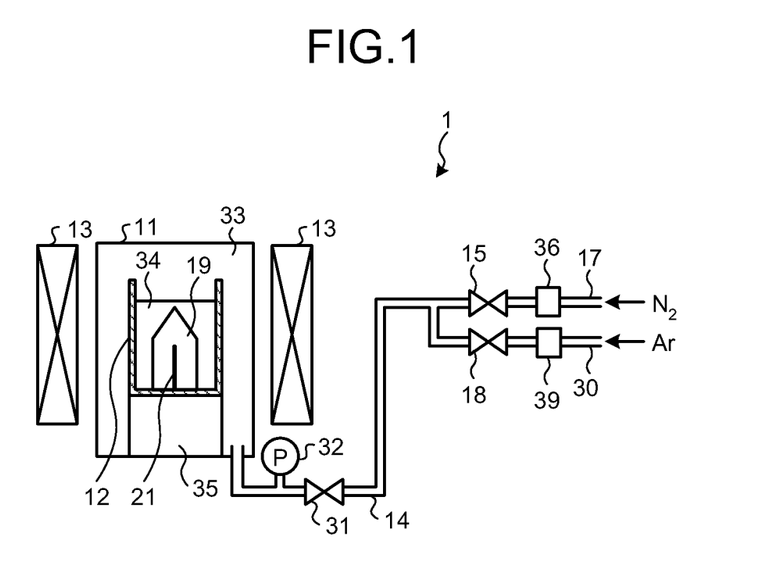
FIG. 1 is a schematic diagram showing an example of a crystal producing apparatus according to an embodiment.

Referring to FIG. 1, a configuration example of the crystal producing apparatus that is used in the method for crystal production of a nitride crystal substrate according to the present embodiment will be described. FIG. 1 is a schematic diagram showing an example of a crystal producing apparatus 1.

As shown in FIG. 1, the crystal producing apparatus 1 includes a pressure resistant vessel 11 made of, for example, stainless steel, which can form an air-tight space. The pressure resistant vessel 11 is detachable from the crystal producing apparatus 1 at the area of a valve 31. Furthermore, a reaction vessel 12 is installed on an installation stand 35 inside the pressure resistant vessel 11. The reaction vessel 12 is detachable from the installation stand 35.

The reaction vessel 12 is a vessel intended for performing crystal growth of a needle-like crystal 21 of a Group III nitride, which serves as a seed crystal, by retaining the needle-like crystal 21 and a mixed molten liquid 34 containing the source materials or additives, and a crucible or the like may be used as the reaction vessel 12. There are no particular limitations on the material of the reaction vessel 12, and a nitride such as a sintered product of BN, or pyrolytic BN (P-BN); an oxide such as alumina, sapphire, or yttrium aluminum garnet (YAG); a carbide such as silicon carbide (SiC); or and the like can be used. According to a suitable embodiment, it is preferable to use a crucible made of YAG.

As shown in FIG. 1, a heater 13 is disposed near the outer periphery of the pressure resistant vessel 11, and the temperature of the mixed molten liquid 34 can be regulated by heating the pressure resistant vessel 11 and the reaction vessel 12 with this heater. The heater 13 may be of any type as long as it is capable of heating the pressure resistant vessel 11, and for example, a two-surface heating type muffle furnace or the like can be used.

In the pressure resistant vessel 11, a gas supply pipe 14, which supplies nitrogen ($N_2$) gas that is a source material for the Group III nitride crystal and a diluent gas, is connected to internal space 33 of the pressure resistant vessel 11. The gas supply pipe 14 is branched into a nitrogen supply pipe 17 and a diluent gas supply pipe 30; and these pipes can be separated from each other with valves 15 and 18.

The nitrogen gas is supplied from the nitrogen supply pipe 17 that is connected to a gas cylinder or the like containing nitrogen gas, has its pressure regulated by a pressure control device 36, and then is supplied to the gas supply pipe 14 through the valve 15. On the other hand, the diluent gas (for example, argon gas) is supplied from the diluent gas supply pipe 30 that is connected to a gas cylinder or the like containing the diluent gas, has its pressure regulated by a pressure control device 39, and is then supplied to the gas supply pipe 14 through the valve 18. The nitrogen gas and diluent gas that have their pressures regulated in this manner are respectively supplied to the gas supply pipe 14 and are mixed therein.

The mixed gas of nitrogen and the diluent gas are then supplied through the gas supply pipe 14 into the pressure resistant vessel 11 via the valve 31. Furthermore, the gas supply pipe 14 is provided with a pressure gauge 32, so that the pressure inside the pressure resistant vessel 11 can be regulated while total pressure inside the pressure resistant vessel 11 is monitored by the pressure gauge 32.

In the present embodiment, when the pressures of the nitrogen gas and the diluent gas are respectively regulated by the valves 15 and 18 and the pressure control devices 36 and 39, the nitrogen partial pressure can be regulated. Furthermore, since the total pressure inside the pressure resistant vessel 11 can be regulated, the evaporation of alkali metals (for example, sodium) in the reaction vessel 12 can be suppressed by increasing the total pressure inside the pressure resistant vessel 11.

It is preferable to use argon (Ar) gas as the diluent gas; however, the diluent gas is not limited to this, and other inert gases may also be used.

Method for Producing Crystal (1) Preparation of Source Materials

In the method for producing a crystal according to the present embodiment, a needle-like crystal of a Group III nitride is used as a seed crystal, and the needle-like crystal is further grown by a flux method. Thus, a single crystal ingot intended for the production of a nitride crystal substrate is produced.

The operation of injecting source materials or additives to the reaction vessel 12 is carried out, after the pressure resistant vessel 11 is detached from the valve 31, and the detached pressure resistant vessel 11 is placed in a glove box filled with an inert gas such as argon gas.

In the reaction vessel 12, a needle-like crystal 21 of a Group III nitride is installed as a seed crystal. According to a suitable embodiment, a needle-like crystal of gallium nitride obtained by a flux method is used as the seed crystal. Thereby, a high quality nitride crystal having a low defect density can be grown. For the method for producing a needle-like crystal according to a flux method, methods that are similar to the related art technologies can be used. For instance, the ratio of the number of moles of an alkali metal (for example, sodium) with respect to the total number of moles of a Group III element (for example, gallium) and the alkali metal is set to 75%, the crystal growth temperature of the mixed molten liquid is set to 860° C., and the nitrogen partial pressure is set to 5.5 MPa.

Furthermore, a substance containing at least a Group III element (for example, gallium) as a constituent material of the mixed molten liquid 34, and an alkali metal (for example, sodium) that is used as a flux are injected into the reaction vessel 12.

An example of the substance containing a Group III element, which may be used a source material, is gallium (Ga) among the elements of Group III, but as additional examples, other Group III elements such as boron, aluminum and indium, or mixtures thereof may also be used.

Suitable examples of the alkali metal that is used as a flux include sodium (Na) and sodium compounds (for example, sodium azide); but as other examples, other alkali metals such as lithium and potassium, and compounds of these alkali metals may also be used. Furthermore, plural kinds of alkali metals may also be used.

According to a suitable embodiment, a trace amount of additives may be injected into the reaction vessel 12. Alternatively, the components of the reaction vessel 12 may be eluted into the mixed molten liquid 34 formed in the reaction vessel 12, by eluting the components of the reaction vessel 12 from the inner wall surface of the reaction vessel 12. Thereby, impurities can be added to a nitride crystal 19, and two regions having different optical characteristics (a first partial region and a second partial region) can be formed inside the crystal.

According to another suitable embodiment, it is preferable to inject carbon (C) as an additive into the reaction vessel 12. Thus, generation of miscellaneous crystals can be suppressed thereby.

There are no particular limitations on the molar ratio of the substance containing a Group III element and the alkali metal; but the molar ratio of the alkali metal with respect to the total number of moles of the Group III element and the alkali metal is preferably 40% to 95%.

After the source materials and the like are injected, the reaction vessel 12 is installed in the pressure resistant vessel 11. The pressure resistant vessel 11 is connected to the crystal producing apparatus 1 by operating the valve 31 while the pressure resistant vessel 11 is charged with an inert gas.

(2) Crystal Growth Temperature and Gas Partial Pressure

As discussed in the above, after the source materials and the like are placed in the pressure resistant vessel 11, electricity is passed through the heater 13, and thus the pressure resistant vessel 11 and the reaction vessel 12 placed therein are heated. The temperature of the mixed molten liquid 34 in the crystal growing process is not particularly limited, but according to a suitable embodiment, the temperature is preferably at least 700° C. or higher. According to a more suitable embodiment, the temperature is preferably in the range of 800° C. to 900° C. (see Example 1).

The nitrogen gas and the diluent gas are regulated to predetermined gas partial pressures by controlling the valves 15 and 18 and the pressure control devices 36 and 39; and at the same time, the mixed gas is introduced into the pressure resistant vessel 11 by opening the valve 31. The nitrogen gas partial pressure in the gas is not particularly limited, but is preferably set to at least 0.1 MPa or higher. According to a more suitable embodiment, the nitrogen gas partial pressure is in the range of 2 MPa to 5 MPa (see Example 1).

According to a still more suitable embodiment, in regard to the source materials in the mixed molten liquid 34 that is injected into the reaction vessel 12, it is preferable to set the ratio of the number of moles of the alkali metal with respect to the total number of moles of the Group III element (for example, gallium) and the alkali metal (for example, sodium) in the range of 70% to 90%; to set the ratio of the number of moles of the additives (for example, carbon) with respect to the Group III element in the range of 0.01% to 5%; to set the crystal growth temperature of the mixed molten liquid 34 in the range of 800° C. to 900° C.; and to set the nitrogen partial pressure in the range of 2 MPa to 5 MPa (see Example 1).

According to a still more suitable embodiment, it is preferable to set the ratio of the number of moles of the additives (for example, carbon) with respect to the Group III element in the range of 0.1% to 1%.

According to another suitable embodiment, it is preferable to change the nitrogen partial pressure or the temperature of the mixed molten liquid 34 at the time point when the nitride crystal 19 has grown to a predetermined size.

In this manner, a minute fluctuation is caused in the crystal growth rate to change the amount of solid solution of the impurities that are taken into the nitride crystal 19 or the amount of defects occurring in the nitride crystal 19; and thereby, plural regions having mutually different optical characteristics can be formed.

According to a more suitable embodiment, it is preferable to change the nitrogen partial pressure or the temperature of the mixed molten liquid 34 immediately before the termination time of crystal growth.

Thereby, a region having different optical characteristics (a second partial region) can be formed near the outer rim portion of the nitride crystal 19; and the effective area that can be used for the production of devices when the nitride crystal is formed into a wafer can be increased.

Figure 2:
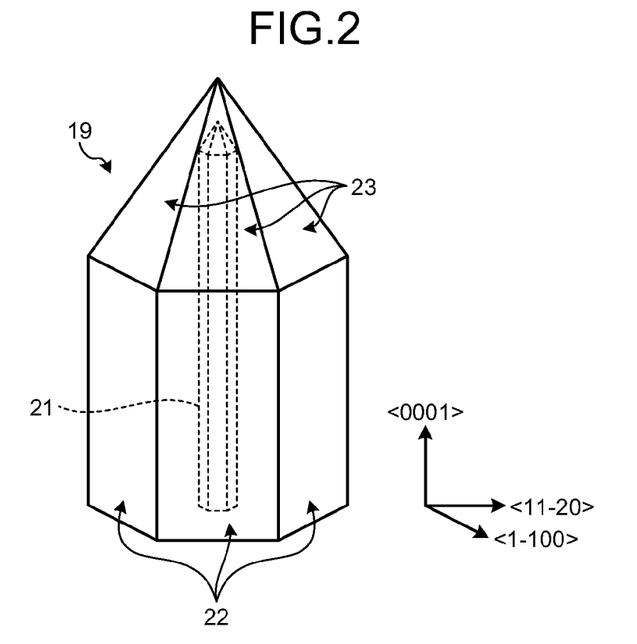
FIG. 2 is an overview diagram showing an example of a GaN single crystal grown from a seed crystal.
Figure 3:
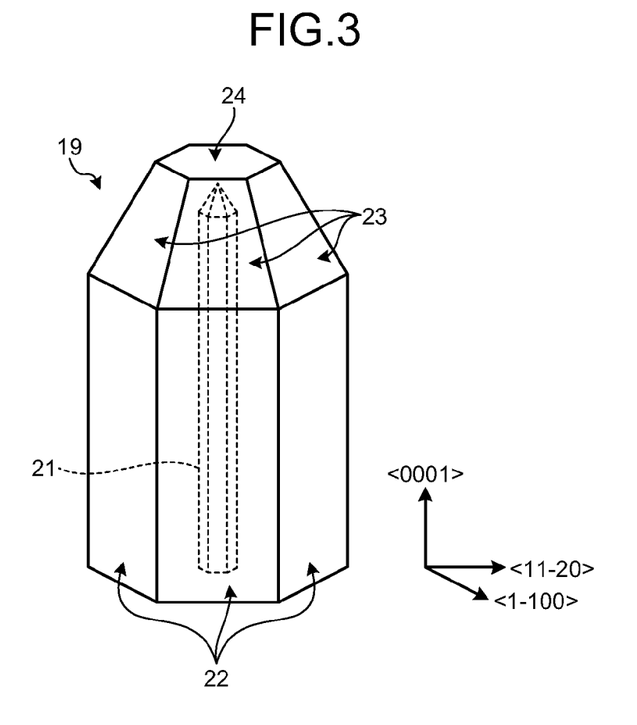
FIG. 3 is an overview diagram showing an example of a GaN single crystal grown from a seed crystal.

As such, when crystal growth is carried out using the needle-like crystal 21 as a seed crystal, a nitride crystal 19 resulting from the crystal growth, such as shown in FIGS. 2 and 3, can be obtained. FIGS. 2 and 3 are overview diagrams of a nitride crystal 19 that has been grown by using the crystal producing apparatus of FIG. 1.

When a needle-like crystal 21 having a prism (hexagonal prism) shape, with one end being pointed into a pyramid (hexagonal pyramid), is grown under the conditions described above as shown in FIGS. 2 and 3, the crystal grows in the diameter directions of the prism-shaped part of the needle-like crystal 21; and the crystal is enlarged in the <0001> direction (the c-axis direction) and the vertical direction thereto. Thus, a crystal, having a larger cross-sectional area when the prism-shaped part of the crystal is cut in the diameter direction, can be obtained.

During the growth of the nitride crystal 19, when the growth rate in the <11-20> direction is higher compared to the growth rate in the <1-100> direction, and when the growth rate in the <0001> direction is higher compared to the growth rate in the <1-101> direction, as shown in FIG. 2, the m-planes 22 and the {1-101} planes 23 emerge as facet planes. Furthermore, the m-planes 22 ({10-10} planes) represent the various outer peripheral planes of a hexagonal prism-shaped nitride crystal 19, and consist of the various planes of the (10-10) plane, (1-100) plane, (01-10) plane, (−1010) plane, (−1100) plane, and (0-110) plane.

On the other hand, during the growth of the nitride crystal 19, when the growth rate in the <11-20> direction is higher compared to the growth rate in the <1-100> direction, and the growth rate in the <0001> direction is about equal to the growth rate in the <1-101> direction or is lower than the growth rate in the <1-101> direction, as shown in FIG. 3, the m-planes 22, the {1-101} planes 23, and the {0001} planes 24 emerge as facet planes.

Furthermore, according to the present embodiment, since crystal growth of a nitride crystal 19 is carried out by a flux method under the conditions described above, the dislocation density can be decreased. For instance, the density of dislocations penetrating through the {0001} planes 24 (c-plane) within a growth sector can be set to $10^3$ cm$^{-2}$ or less, and the performance of produced devices can be improved.

Production of Single Crystal Wafer (1) Slice Processing of Nitride Crystal

Figure 4:
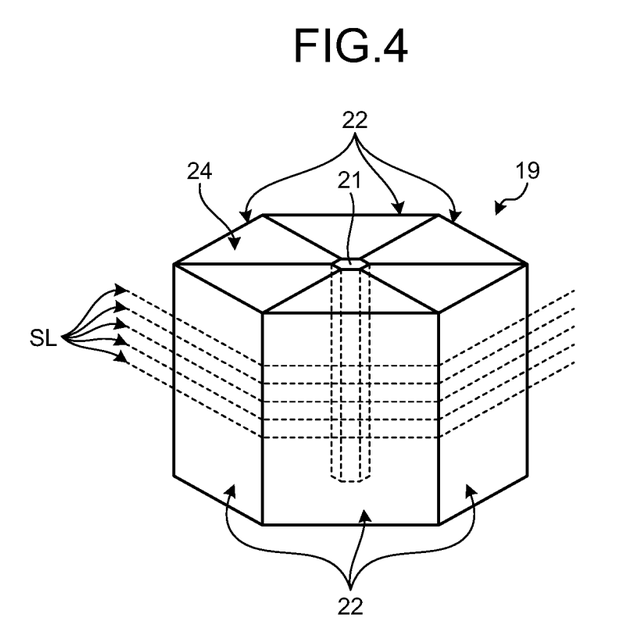
FIG. 4 is an exterior perspective view showing a GaN single crystal.

In the nitride crystal 19 shown in FIGS. 2 and 3, when the pyramid-shaped part surrounded by the {1-101} plane 23 is removed by cutting in parallel to the plane 24 (c-plane), a prism-shaped nitride crystal 19 such as shown in FIG. 4 is obtained. The nitride crystal 19 has grown in the directions approximately perpendicular to the <0001> direction, while forming the m-planes 22 from the needle-like crystal 21 as the seed crystal.

Figure 5A:
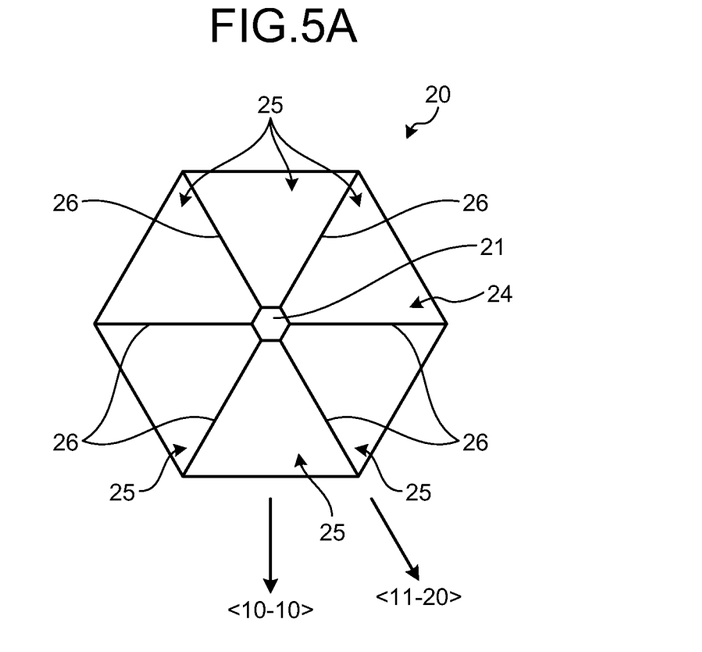
FIG. 5A is a schematic plan view showing an example of a GaN substrate.
Figure 5B:
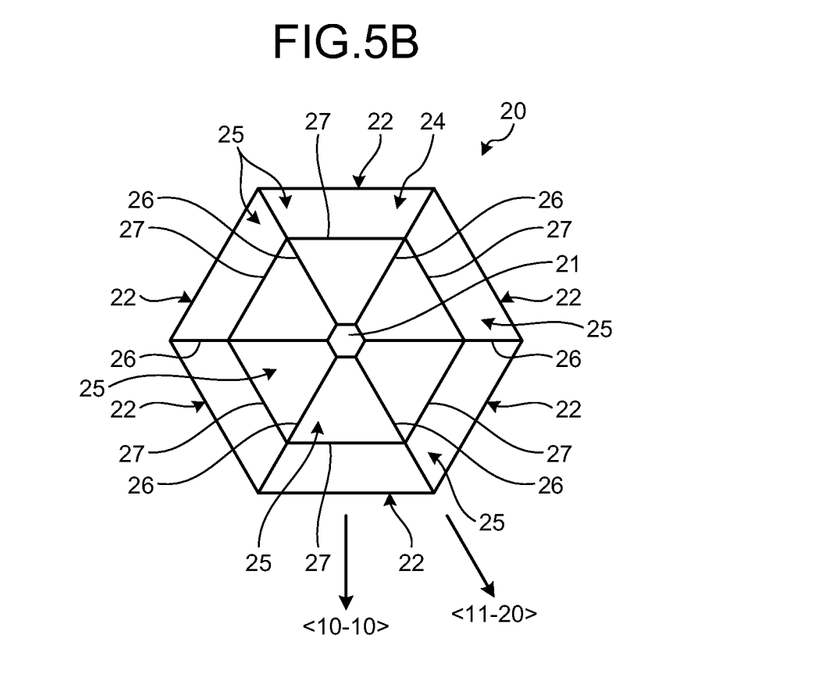
FIG. 5B is a plan view showing an example of a GaN substrate having growth striation.

Subsequently, the nitride crystal 19 is sliced approximately in parallel to the {0001} plane 24 (c-plane) along the cutting line SL using a multi wire saw, a nitride crystal substrate 20 such as shown in FIG. 5A or 5B is obtained. Furthermore, the nitride crystal 19 may also be cut at an angle inclined by a few degrees from the <0001> direction.

FIGS. 5A and 5B are schematic plan views showing the nitride crystal substrate 20 obtained after slicing. As shown in FIGS. 5A and 5B, the nitride crystal substrate 20 has a needle-like crystal 21 near the center, and the crystal diameter expands and grows from the needle-like crystal 21 in the directions approximately perpendicular to the <0001> direction. Next, a suitable embodiment will be explained, with reference to FIG. 5A or 5B.

(2) As to Formation of Growth Sector Boundary Surface

First, a suitable embodiment will be described with reference to FIG. 5A. According to a suitable embodiment, it is preferable that growth sectors 25 having mutually different optical characteristics (first partial region) and growth sector boundary surfaces 26 (second partial region) be formed as shown in FIG. 5A, in the nitride crystal 19 and the nitride crystal substrate 20 by the crystal growing process described above.

In general, during the crystal growth, in the case where the crystal grows while different crystal faces are formed adjacently, or in the case where crystallographically equivalent crystal faces are growing, when the respective crystal growth directions are different from each other, the plural growth sectors 25 that have grown into the respective crystal faces, and the growth sector boundary surfaces 26 which are boundary surfaces between adjacent growth sectors 25, may be formed.

When a hexagonal prism-shaped nitride crystal 19 (for example, a GaN crystal) is grown by the crystal growth method described above, the crystal grows while the {10-10} planes (m-planes 22), that is, crystallographically equivalent (10-10) plane, (1-100) plane, (01-10) plane, (−1010) plane, (−1100) plane and (0-110) plane are formed at the faces which are perpendicular to the c-axis of the needle-like crystal 21. The growth rates of the various crystal faces are approximately equal, but since the growth directions are different, there are formed growth sector boundary surfaces 26 of the crystal which have grown at various crystal faces in the <11-20> direction, and six growth sectors 25 can be formed around the seed crystal 21.

Figure 6:
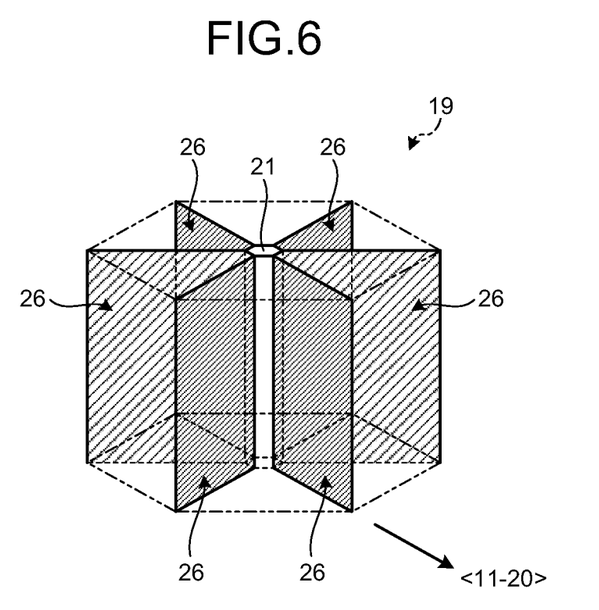
FIG. 6 is a schematic diagram showing an example of a growth sector boundary surface.

FIG. 6 is a schematic diagram showing an example of the growth sector boundary surfaces 26 that are formed at the nitride crystal 19. As shown by the regions indicated with an oblique line pattern in FIG. 6, the formation of the growth sector boundary surfaces 26 is initiated from each of the six edges formed by adjacent lateral surfaces of the hexagonal prism-shaped needle-like crystal 21, and the growth sector boundary surfaces 26 are formed as planes that are approximately parallel to the <11-20> direction.

Furthermore, when the nitride crystal 19 is sliced as explained with FIG. 4, the growth sector boundary surfaces 26 appear at the cut surfaces of the resulting nitride crystal substrate 20, as six linear regions that extend in the <11-20> direction from the surfaces of the needle-like crystal 21 as shown in FIG. 5A.

Furthermore, in the growth sector boundary surfaces, impurities are likely to be selectively incorporated, and defects are prone to be concentrated at the growth sector boundary surfaces 26. That is, in the growth sector boundary surfaces 26, a fluctuation in the growth rates of the various growth sectors 25, solid solution of impurities, and generation of point defects occur in a coupled manner. Therefore, in the growth sector boundary surfaces 26 and their vicinities, strains are introduced into the crystal lattices, and the refractive index changes. Furthermore, in the growth sector boundary surfaces 26 and their vicinities, the composition of the crystal is locally varied due to solid solution of impurities or generation of point defects, and accordingly, the light transmittance locally changes, resulting in coloration of the growth sector boundary surfaces 26.

Although the nitride crystal 19 (nitride crystal substrate 20) is a transparent crystal having high light permeability, in the present embodiment, the optical characteristics (refractive index, transmittance, color and the like) of the growth sector boundary surfaces 26 become different from the optical characteristics of other crystal regions (for example, the growth sectors 25) as such. Therefore, the growth sector boundary surfaces 26 can be clearly verified even by visual inspection, and the crystal orientation can be discriminated by using the growth sector boundary surfaces 26 as a marker.

It was described above that there are six growth sectors 25, but this number is a number obtainable in the case where the nitride crystal 19 is a hexagonal prism-like crystal, and crystal growth is carried out (for example, a GaN crystal) while six m-planes 22 are formed around a seed crystal. The number of the growth sectors 25 may vary depending on the crystal structure and the number of crystal faces that appear during the crystal growth.

(3) As to Formation of Growth Striation

Next, another suitable embodiment will be described with reference to FIG. 5B. According to the suitable embodiment, it is preferable that, in the nitride crystal 19 and the nitride crystal substrate 20, a growth striation 27 (second partial region) having optical characteristics that are different from those of other regions in the crystal be formed as shown in FIG. 5B, which appear as a result of the crystal growing process described above.

In general, when the crystal growth rate fluctuates during crystal growth, a fluctuation also occurs in the amount of defects produced or in the amount of solid solution of impurities; and the growth striation 27 may be formed on the planes that follow specific crystal faces.

According to the present embodiment, at the time point when the nitride crystal 19 has grown to a predetermined size in the crystal growing process described above, minute changes are applied to the temperature of the mixed molten liquid 34, the nitrogen partial pressure, the amount of flux dissolved in the mixed molten liquid 34, or the like. In this manner, a minute fluctuation or a minute change is caused in the crystal growth rate of the nitride crystal 19; and thereby, changes are caused in the amount of impurities incorporated into the nitride crystal 19 or in the amount of point defects such as holes, so that the growth striation 27 is formed.

Figure 7:
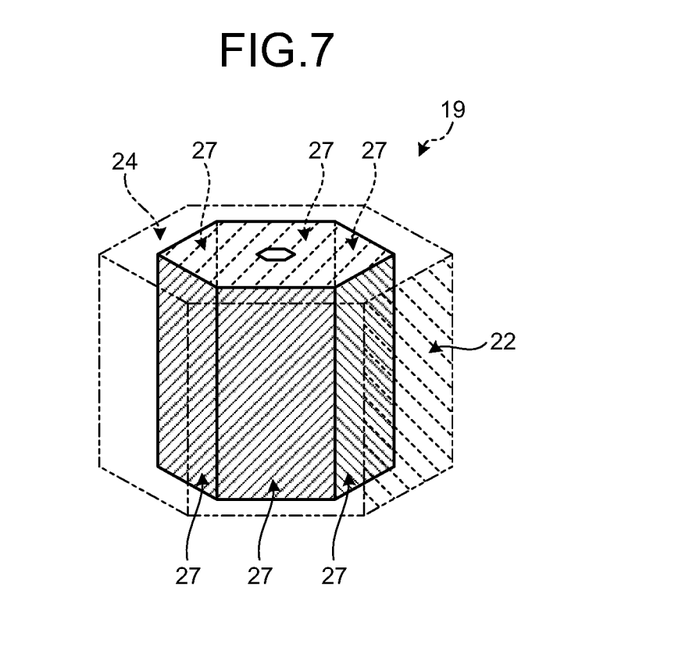
FIG. 7 is a schematic diagram showing an example of growth striation.

FIG. 7 is a schematic diagram showing an example of the growth striation 27 that is formed in the nitride crystal 19. As shown in FIG. 7, the growth striation 27 consists of six planes that constitute a hexagonal prism which is in a concentric cylindrical form with the hexagonal prism of the nitride crystal 19. Furthermore, the respective planes of the growth striation 27 are composed of planes that are parallel to the m-plane 22 that constitutes the surfaces of the nitride crystal 19.

When the nitride crystal 19 is sliced as explained with FIG. 4, the cut surfaces of the nitride crystal substrate 20 thus obtained looks as shown in FIG. 5B. Also, as shown in FIG. 5B, the growth striation 27 appears as lines of a hexagon that is concentric with the outer peripheral surface of the needle-like crystal 21 in the {0001} plane 24 (c-plane) of the nitride crystal substrate 20. Furthermore, the respective edges of the hexagonal-shaped growth striation 27 are formed in parallel to the m-planes 22, which are the outer peripheral surfaces of the nitride crystal substrate 20.

Since the growth striation 27 has a composition that is different from the other areas of the crystal, the refractive index thereof differs from that of the other areas in the crystal (for example, the growth sectors 25). Therefore, the growth striation 27 is under the effect of diffuse reflection of light or coloration. Therefore, the growth striation 27 (second partial region) attains optical characteristics different from those of the other region (first partial region) of the crystal, so that the growth striation 27 can be clearly recognized even by visual inspection.

Hence, the crystal orientation of a nitride crystal substrate 20 can be identified by using the growth striation 27 as a marker. In the example shown in FIG. 5B, the m-planes 22 can be discriminated by using the growth striation 27 as a marker, so that by using the m-planes 22 as reference planes, the crystal orientation of the other planes can be discriminated.

As such, since the nitride crystal 19 of the present embodiment has formed therein growth sector boundary surfaces 26 or growth striations 27, which have different optical characteristics, even if the colorless, transparent nitride crystal 19 is placed on a white or colorless base, the location of the nitride crystal 19 can be verified.

Furthermore, the growth sector boundary surfaces 26 and the growth striations 27 thus formed can be formed in the middle of crystal growth. Accordingly, the crystal orientation can be determined even without forming the OF or IF in the nitride crystal 19.

(4) Wafer Processing Treatment

The nitride crystal substrate 20 obtained by slicing the nitride crystal 19 as explained above (see FIGS. 5A and 5B), is subjecting to shaping processing in accordance with the shape of the susceptor that is used in the device production processes.

Figure 8A:
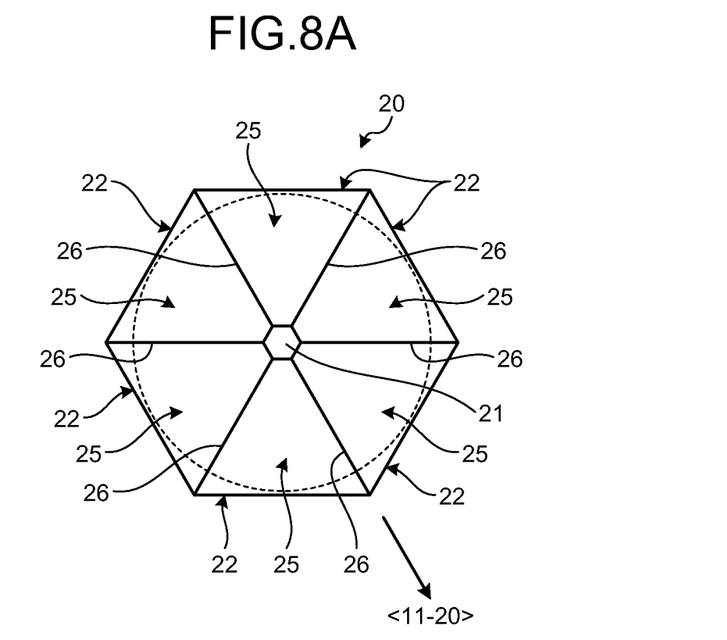
FIG. 8A is a schematic plan view showing a GaN substrate.
Figure 8B:
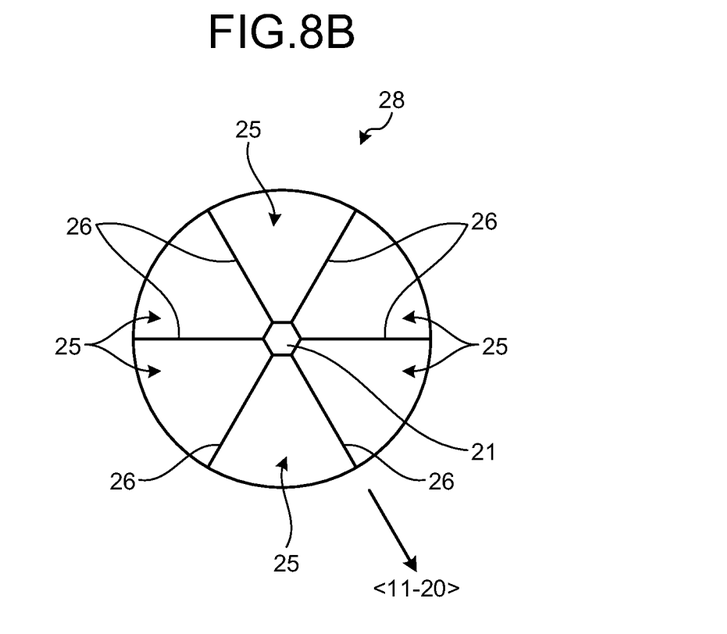
FIG. 8B is a schematic plan view showing a GaN wafer.

FIG. 8A is a plan view showing an example of a nitride crystal substrate 20 prior to the shaping processing; and FIG. 8B is a plan view showing an example of a nitride wafer 28 obtained after the shaping processing. When the shape of the susceptor used in the device production process is a shape equivalent to a circle, the nitride wafer is shaping processed into a circular shape as shown in FIG. 8B.

The shaping process that is performed to make the substrate into a circular shape may be carried out by shaping a nitride crystal 19 into a cylindrical shape before the nitride crystal 19 is sliced. In this case, the nitride crystal may be slice processed after the shaping into a cylinder, to obtain a circular-shaped nitride wafer 28.

The wafer shape is not limited to a circular shape. For example, when the susceptor shape is a shape equivalent to a hexagon, the nitride crystal substrate 20 can be put to use while maintaining a hexagonal shape. In this case, the chamfering processing step can be omitted, and this leads to a reduction in cost.

The shaped nitride wafer 28 has its surface quality improved by lapping and polishing to the EPI grade (a quality capable of epitaxial growth of a crystal for device application). Thereby, a nitride wafer 28 for device production purposes can be obtained.

CRYSTAL PRODUCTION EXAMPLES

Next, suitable embodiments of a nitride crystal substrate 20 prior to processing treatment and a nitride wafer 28 obtainable after processing treatment will be explained referring to FIGS. 8A to 11B. FIGS. 8A to 11B are diagrams respectively illustrating a nitride crystal substrate 20 that may be obtained by the crystal production method and the slice processing treatment described above (FIGS. 8A, 9A, 10A, and 11A), and a nitride wafer 28 that may be obtained after wafer processing of the nitride crystal substrate 20 (FIGS. 8B, 9B, 10B, and 11B).

Crystal Production Example 1

FIGS. 8A and 8B show that colored growth sector boundaries 26 are formed in parallel to the <11-20> direction, arising from the surfaces of the needle-like crystal 21 toward the outer rim of the nitride crystal substrate 20. As depicted in the diagrams, the growth sector boundary surfaces 26 appear on the surface of the nitride crystal substrate 20 in the form of lines growing approximately in the <11-20> direction. Thus, the crystal orientation of the <11-20> direction can be determined by visual inspection, and the crystal orientation of the other planes can also be determined by taking the <11-20> direction as a reference.

Crystal Production Example 2

Figure 9A:
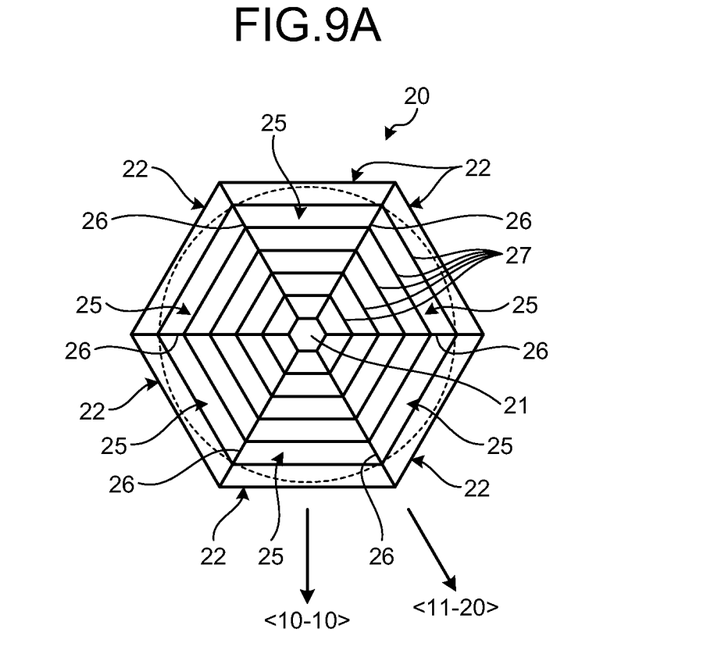
FIG. 9A is a schematic plan view showing a GaN substrate.
Figure 9B:
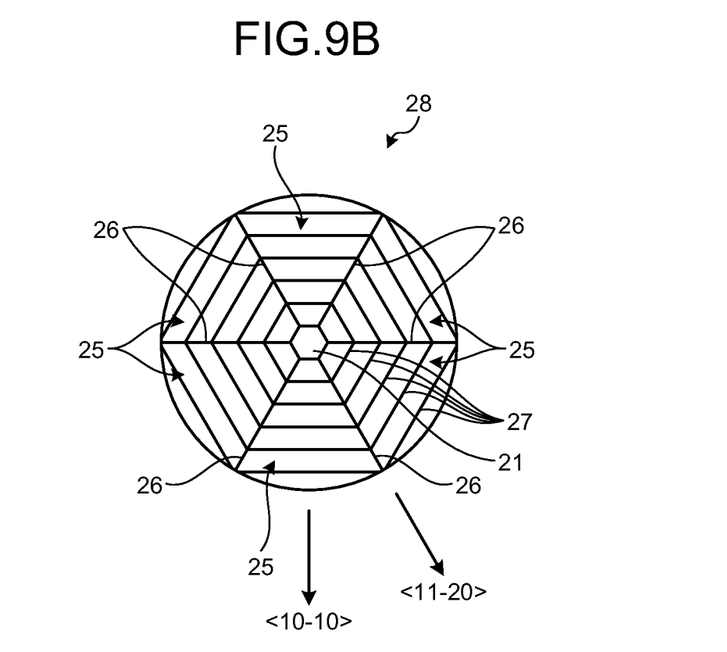
FIG. 9B is a schematic plan view showing a GaN wafer.

FIGS. 9A and 9B illustrate that colored growth sector boundaries 26 are formed in parallel to the <11-20> direction, arising from the surfaces of the needle-like crystal 21 toward the outer rim of the nitride crystal substrate 20, and that a plurality of colored growth striations 27 is also formed in parallel to the m-planes 22. As shown in FIG. 9A, since each of the growth striations 27 is formed in parallel to the m-planes 22 in the crystal which has grown from the m-planes 22 as growing surfaces, the crystal orientation of the <10-10> direction can be seen.

Crystal Production Example 3

Figure 10A:
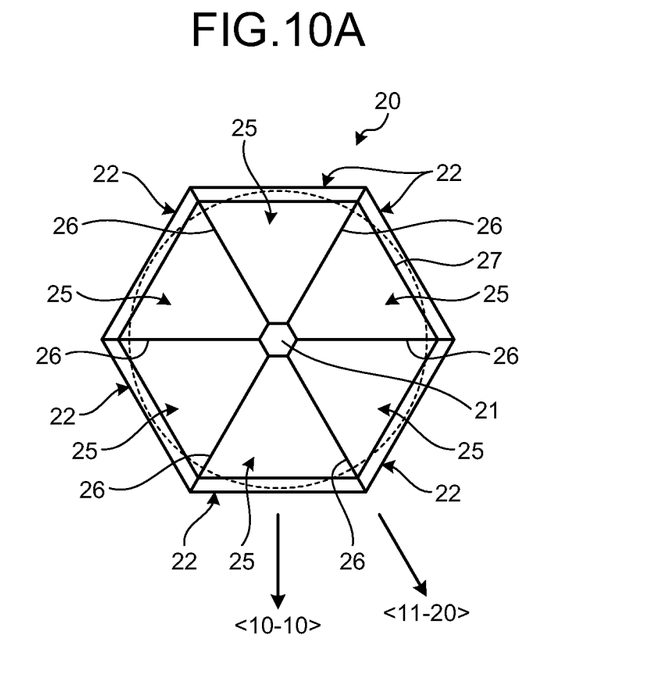
FIG. 10A is a schematic plan view showing a GaN substrate.
Figure 10B:
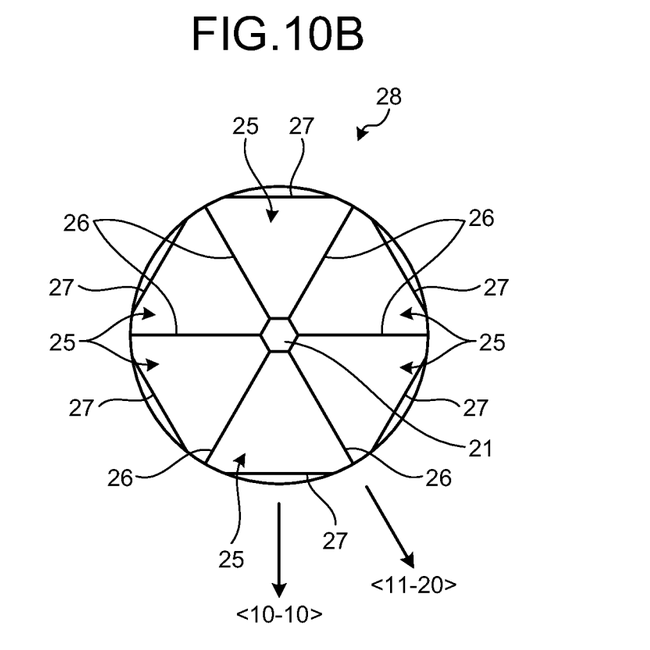
FIG. 10B is a schematic plan view showing a GaN wafer.

FIGS. 10A and 10B show that colored growth sector boundaries 26 are formed in parallel to the <11-20> direction, arising from the surfaces of the needle-like crystal 21 toward the outer rim of the nitride crystal substrate 20, and that a portion of colored growth striation 27 is formed in parallel to the m-planes 22 near the outer periphery of the nitride crystal substrate 20. In this case, the <11-20> direction and the <10-10> direction of the nitride crystal substrate 20 can be discriminated.

When the nitrogen partial pressure or the temperature of the mixed molten liquid 34 is changed immediately before the termination time of crystal growth during the crystal growing process described above, a growth striation 27 can be formed near the outer rim of the nitride crystal 19 as shown in FIGS. 10A and 10B. Even in this case, the <11-20> direction and the <10-10> direction of the nitride crystal substrate 20 can be discriminated. Furthermore, since the growth striation 27 is formed near the outer rim of the nitride crystal 19 (nitride crystal substrate 20), the effective area that can be utilized at the time of device production can be increased.

Crystal Production Example 4

Figure 11A:
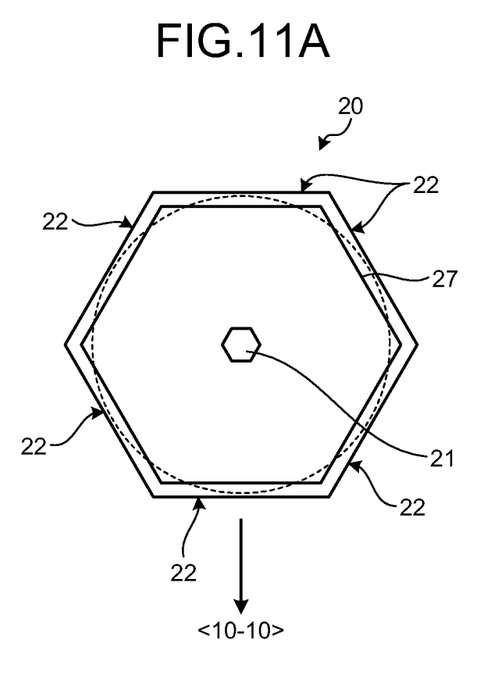
FIG. 11A is a schematic plan view showing a GaN substrate.
Figure 11B:
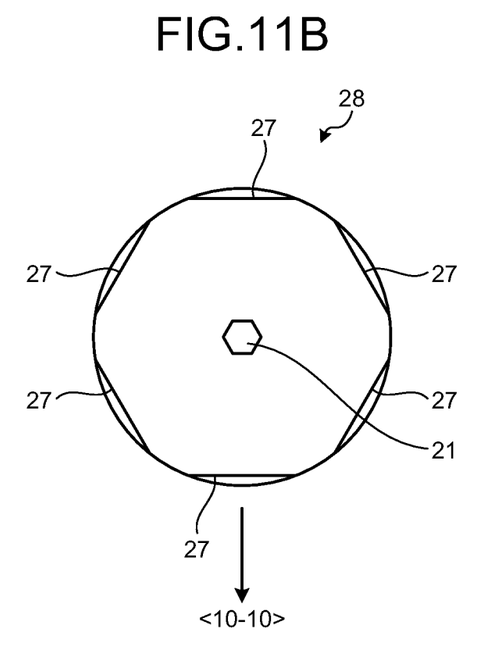
FIG. 11B is a schematic plan view showing a GaN wafer.

FIGS. 11A and 11B show that the growth sector boundaries 26 are hardly recognizable by visual inspection, but a portion of the growth striation 27 is formed in parallel to the m-planes 22 near the outer periphery of the substrate.

Even when the growth sector boundary 26 or the growth striation 27 is not easily recognizable with the naked eye, the growth sector boundary 26 and the growth striation 27 can be identified by using an appropriate optical observation techniques such as a cathode luminescence method (CL method); and thereby the crystal orientation can be specified. For example, since impurities or point defects have been incorporated in the growth sector boundary surfaces 26, the growth sector boundary surfaces 26 and the low defect regions within the growth sectors have different contrast ratios in CL images. Based on this result, the crystal orientation for the nitride crystal substrate 20 can be specified, and in the example shown in FIGS. 11A and 11B, the <10-10> direction can be discriminated. Therefore, the crystal orientation can be discriminated even without processing any OF or IF in the nitride crystal substrate 20.

As discussed above, according to the crystal production method of the present embodiment, growth sector boundary surfaces 26 or growth striations 27, which have optical characteristics that are different from those of the growth sectors 25, can be formed within a nitride crystal 19. Thus, the location of the crystal and the crystal orientation can be easily identified without subjecting the nitride crystal 19 to any processing treatment.

EXAMPLES

Hereinafter, the present invention will be described in more detail by way of Examples, but the present invention is not intended to be limited to these Examples. The numerals correspond to the configuration of the crystal producing apparatus explained with reference to FIG. 1.

Example 1

A reaction vessel 12 having an inner diameter of 17 mm and a height of 50 mm was placed in a glove box under an argon (Ar) atmosphere, and the operation of introducing source materials and the like was carried out therein. First, a needle-like crystal 21 produced by a Na flux method was provided on the bottom of the reaction vessel 12 such that the needle-like crystal 21 was approximately perpendicular to the bottom of the reaction vessel 12. Subsequently, 3 g of gallium (Ga) as a Group III element, 4.5 g of sodium (Na) which served as a flux, and 0.014 g of carbon (C) as an additive were placed in the reaction vessel 12.

Next, the reaction vessel 12 was placed in a pressure resistant vessel 11 which was made of stainless steel and had an external diameter of 1 inch, and was sealed. The valve 31 was then closed, and the pressure resistant vessel 11 was removed from the glove box and was placed in a heater 13. Subsequently, the pressure resistant vessel 11 and the gas supply pipe 14 were connected through a valve 31. The gas supply pipe 14 was purged several times with nitrogen gas, and then the valve 31 was opened to introduce $N_2$ gas into the internal space 33 until the nitrogen partial pressure at room temperature reached 1.5 MPa. Subsequently, electricity was passed through the heater 13, and thereby the temperature was raised over one hour until the temperature reached 870° C. During the temperature rise, gallium, sodium and carbon melted and formed a mixed molten liquid 34. When the temperature reached 870° C., it was confirmed that the pressure rise due to the volumetric expansion of $N_2$ gas stopped, and then the pressure of the $N_2$ gas was adjusted to 3.2 MPa. Thus, crystal growth was initiated.

The duration of crystal growth was set to 192 hours. After completion of the crystal growth, the passage of electricity to the heater 13 was stopped, it was awaited that the pressure resistant vessel 11 was cooled to room temperature, and then the pressure resistant vessel 11 was detached from the crystal producing apparatus 1. The reaction vessel 12 was then taken out from the pressure resistant vessel 11; and the reaction vessel 12 was immersed in a beaker filled with ethanol so as to remove Na. After the removal of Na, the Ga—Na intermetallic compound as removed with nitric acid or aqua regia, and a GaN crystal 19 (nitride crystal 19) were taken out.

The GaN crystal 19 was surrounded with the m-planes 22 and the {1-101} planes 23 as shown in FIG. 2.

In the GaN crystal 19, the length of the <11-20> direction was about 8 mm, and the length of the <0001> direction was about 12 mm. Furthermore, the yield (amount of GaN precipitation [mol]/amount of Ga injection [mol]×100%) calculated from the weight variation between the needle-like crystal 21 and the GaN crystal 19 obtained after crystal growth, was about 75%.

Thereafter, the GaN crystal 19 was cut, and a GaN crystal 19 such as shown in FIG. 4 and described in the above was obtained. As shown in FIG. 4, the GaN crystal 19 had a needle-like crystal 21 near the center, and had a shape resulted by expanding and growing the crystal from the needle-like crystal 21 in the direction approximately perpendicular to the <0001> direction.

This GaN crystal 19 was sliced with a multi wire saw, and a GaN crystal substrate 20 (nitride crystal substrate 20) such as shown in FIG. 5A was obtained. As shown in FIG. 5A, the regions grown from the needle-like crystal 21 consisted of six growth sectors 25, and the growth sector boundaries 26 of the growth sectors were formed approximately in parallel to the <11-20> direction. Furthermore, coloration of the crystal could be recognized at the growth sector boundary surfaces 26 and the regions near the growth sector boundary surfaces 26.

The GaN crystal substrate 20 was etched for 20 minutes at 250° C. using a mixed acid of phosphoric acid and sulfuric acid. Subsequently, the GaN crystal substrate was observed with an optical microscope, and the etch pit density within the growth sectors 25 was measured, which was found to be about $1 \times 10^4$ $cm^{-2}$.

The rocking curve in the growth sectors 25 of the GaN crystal substrate 20 was measured by an X-ray diffraction method; and the FWHM (full width at half-maximum) value at a slit width of 0.1×0.1 mm was 34 arcsec in the (0004) plane.

The interior of the growth sectors 25 of the GaN crystal substrate 20 was analyzed by a cathode luminescence method (CL method); and 10 dark spots were observed in an area with a size of 41 μm×1 mm. When it was assumed that the dark spots corresponded to dislocations, the dislocation density of this crystal was estimated to be $3 \times 10^4$ per square centimeter.

Subsequently, the GaN crystal substrate 20 was shaping processed into a circular shape, as indicated with a broken line in FIG. 8A, and thus a GaN wafer 28 (nitride wafer 28) such as shown in FIG. 8B was obtained. As shown in FIG. 8B, the growth sector boundaries 26 were formed in parallel to the <11-20> direction, arising from the needle-like crystal 21 toward the outer rim of the substrate; and coloration was recognized as explained above. Thereby, the crystal orientation of the <11-20> direction could be identified by visual inspection. The location of the crystal could also be identified by visual inspection.

Example 2

In the following Example, explanations may not be repeated for the same configuration and method as those employed in Example 1. In Example 2, crystal growth was performed under approximately the same conditions as in Example 1, except that fluctuations in pressure were applied several times, and thus a GaN crystal substrate 20 and a GaN wafer 28 were produced. As a result, as shown in FIGS. 9A and 9B, the resulting GaN crystal substrate 20 and the GaN wafer 28 obtained after processing had growth sector boundaries 26 formed in parallel to the <11-20> direction, arising from the needle-like crystal 21 toward the outer rim of the substrate. In addition, colored growth striations 27 were formed in parallel to the m-planes 22. It is believed that the colored growth striations 27 were formed because, due to the fluctuations in the nitrogen pressure during the crystal growth, the growth rate changed, and the amount of impurities incorporated into the crystal increased. Although not clearly known, the origin of the impurities is thought to be attributable to the components eluted from the YAG crucible.

Example 3

Crystal growth of the GaN crystal 20 was performed under approximately the same conditions as in Example 1, except that at the stage where the crystal had grown to a predetermined size, the nitrogen partial pressure was increased or decreased. As a result, as shown in FIGS. 10A and 10B, the resulting GaN crystal 20 and the GaN wafer 28 obtained after processing had growth sector boundaries 26 formed in parallel to the <11-20> direction, arising from the needle-like crystal 21 toward the outer rim of the substrate. Furthermore, a portion of colored growth striation 27 was formed near the outer periphery of the substrate, in parallel to the m-planes 22. As such, when the nitrogen pressure was increased or decreased at the stage where the crystal had grown to a predetermined size, colored growth striations 27 could be formed.

Example 4

A GaN crystal 20 was produced under approximately the same conditions as in Example 1. As a result, a GaN crystal substrate 20 and a GaN wafer 28 such as shown in FIGS. 11A and 11B were obtained. As shown in FIGS. 11A and 11B, the GaN crystal substrate 20 and the GaN wafer 28 had growth sector boundaries 26 formed only to the extent that recognition thereof was much hard by the naked eye. However, a small portion of colored growth striation 27 was formed near the outer periphery of the substrate, in parallel to the m-planes 22. It is speculated that this was because the amount of impurities incorporated or the amount of defects was small, and therefore, coloration of the crystal was formed only to a small extent in the areas close to the outer periphery.

As shown in the above Examples, when the nitrogen partial pressure was varied during crystal growth, or impurities were incorporated during crystal growth, colored growth sector boundaries 26 or colored growth striation 27 could be formed. Thereby, the location of the GaN crystal substrate 20 could be identified by visual inspection, and the crystal orientation of the GaN crystal substrate 20 could be determined by visual inspection.

According to the present embodiment, since a second partial region having optical characteristics that are different from those of other regions is formed, the crystal planes can be examined by visual inspection, and the location and crystal orientation of a crystal can be easily and advantageously recognized visually even without any processing treatment.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A nitride crystal which encircles an outer periphery of a seed crystal, the nitride crystal comprising:
   first partial regions, and
   second partial regions, each second partial region being a plane region positioned between two of the first partial regions and having optical characteristics different from those of the first partial regions.

2. The nitride crystal according to claim 1, wherein the second partial regions are regions having a higher amount of defects or a higher amount of solid solution of impurities compared with the first partial regions.

3. The nitride crystal according to claim 1, wherein the second partial regions are growth sector boundaries formed within the nitride crystal.

4. The nitride crystal according to claim 1, wherein the second partial regions are growth striations formed within the nitride crystal.

5. The nitride crystal according to claim 3,
   wherein the nitride crystal and the seed crystal both have a hexagonal crystal structure, and
   wherein the growth sector boundaries are formed in the form of planes that are approximately parallel to the <11-20> direction, the formation being initiated from each edge formed by adjacent lateral surfaces of a hexagonal prism shape of the seed crystal.

6. The nitride crystal according to claim 4, wherein the growth striations are formed near the outer rim of the nitride crystal.

7. The nitride crystal according to claim 4,
   wherein the nitride crystal and the seed crystal both have a hexagonal crystal structure, and
   wherein the growth striations are formed in parallel to {10-10} planes of the nitride crystal.

8. The nitride crystal according to claim 1,
   wherein dislocation density in the nitride crystal is $10^5$ cm$^{-2}$ or less.

9. The nitride crystal according to claim 1,
wherein the nitride crystal is produced by
    forming a mixed molten liquid of an alkali metal and a substance containing at least a Group III element in a reaction vessel;
    installing a seed crystal inside the reaction vessel;
    bringing a gas containing nitrogen into contact with the mixed molten liquid;
    dissolving the nitrogen in the gas into the mixed molten liquid; and
    thereby growing the seed crystal into a crystal made from the Group III element in the mixed molten liquid and the nitrogen dissolved in the mixed molten liquid.

10. The nitride crystal according to claim 1, wherein the second partial regions are growth sector boundary surfaces which (a) extend from inside of the nitride crystal to edges joining two outside surfaces of the nitride crystal and (b) are formed between two first partial regions having optical characteristics different from those of the growth sector boundary surfaces.

11. The nitride crystal according to claim 1, wherein the second partial regions are growth striations which are parallel to faces consisting of an outer surface of the nitride crystal and are formed between two first partial regions having optical characteristics different from those of the growth striations.

* * * * *